(12) United States Patent
Massopust et al.

(10) Patent No.: US 8,156,641 B2
(45) Date of Patent: Apr. 17, 2012

(54) INTERCONNECTION METHOD FOR TIGHTLY PACKED ARRAYS WITH FLEX CIRCUIT

(75) Inventors: Dan Leo Massopust, Powell Butte, OR (US); John Richard Andrews, Fairport, NY (US); Chad J. Slenes, Sherwood, OR (US)

(73) Assignee: Xerox Corporation, Norwalk, CT (US)

( * ) Notice: Subject to any disclaimer, the term of this patent is extended or adjusted under 35 U.S.C. 154(b) by 338 days.

(21) Appl. No.: 12/470,047

(22) Filed: May 21, 2009

(65) Prior Publication Data
US 2010/0294545 A1 Nov. 25, 2010

(51) Int. Cl.
*H05K 3/30* (2006.01)
(52) U.S. Cl. ............... 29/832; 29/842; 29/843; 29/874; 29/876; 324/754.01

(58) Field of Classification Search .............. 29/825, 29/832, 842, 843, 874, 876; 324/158.1, 754, 324/754.01
See application file for complete search history.

(56) References Cited

U.S. PATENT DOCUMENTS

| | | | |
|---|---|---|---|
| 6,255,126 B1 * | 7/2001 | Mathieu et al. | 438/15 |
| 6,998,539 B2 | 2/2006 | Andrews et al. | |
| 7,876,087 B2 * | 1/2011 | Mok et al. | 324/750.3 |
| 2007/0131451 A1 | 6/2007 | Schmachtenberg, III et al. | |
| 2007/0132812 A1 | 6/2007 | Massopust et al. | |
| 2008/0061808 A1 * | 3/2008 | Mok et al. | 324/758 |
| 2010/0294545 A1 * | 11/2010 | Massopust et al. | 174/254 |

FOREIGN PATENT DOCUMENTS
EP 2141973 6/2010
* cited by examiner

*Primary Examiner* — Carl Arbes
(74) *Attorney, Agent, or Firm* — MH2 Technology Law Group LLP (57) ABSTRACT

Exemplary embodiments provide interconnects and methods for interconnecting an electrical device array with a flexible circuit by filling a chemically-etched or laser-ablated integral stencil with conductive materials.

17 Claims, 5 Drawing Sheets

INTERCONNECTION METHOD FOR TIGHTLY PACKED ARRAYS WITH FLEX CIRCUIT

FIELD OF THE USE

The present teachings relate generally to interconnects for packaging electrical devices and, more particularly, to interconnects and methods for interconnecting tightly packed electrical device arrays with a flexible circuit.

BACKGROUND

Interconnect technologies are widely used for packaging electrical devices. Conventional interconnect technologies include use of Z-axis tapes, wire bondings, and ball grid arrays (BGAs) as well as other solid solder interconnects. As packing density of electrical devices increases, however, conventional interconnect technologies may face reliability and cost challenges For example, when Z-axis tapes are used as interconnects, they may become unreliable in high temperature operation as occurs in solid ink print heads. When wire bonding interconnects are used, because the wire loop must be short, it is difficult to interconnect tightly packed 2-D electrical device arrays. In another example for BGAs or other solid solder interconnects, although they are capable of interconnecting small devices, thermal stress may break the connections for device arrays spanning over large distances.

In addition to the reliability and cost challenges, conventional interconnect technologies may have some other drawbacks. For example, a typical electrical device package may include an electrical device array interconnected with a flexible (or flex) circuit. The flex circuit often includes contact pads and external contacts (e.g., contact leads) and is often placed over the device array. When packaging a high density array of devices (e.g., >1000 devices per square inch), the overlaid flexible circuit has to provide contact leads very close to the contact pads for each electrical device of the array. This makes electrical interconnect between the devices and the flex circuit more challenging. For example, a Z-axis conductive adhesive film may create connection between the contact pads of the flex circuit and the devices, and may also undesirably connect other contact leads to the same electrical device of the array.

Thus, there is a need to overcome these and other problems of the prior art and to provide interconnects and methods for interconnecting tightly packed electrical device array with a flex circuit.

SUMMARY

According to various embodiments, the present teachings include a method for electrically interconnecting an electrical device with a flex circuit and thus to provide separate electrical paths or electrical connections there-between. In this interconnecting method, a contact pad of a flexible circuit can be pre-aligned with an array element of an electrical device array having a standoff layer disposed between the contact pad and the array element. The standoff layer can further include an opening and the contact pad can cover a portion of the opening. Then, a substrate portion of the flexible circuit can be removed to form a through-hole along the flexible circuit and to expose the contact pad. Conductive materials can be filled into the opening of the standoff layer and into the formed through-hole along the flexible circuit contacting the contact pad of the flexible circuit and contacting a bond pad or an electrode of the array element so as to establish an electrical continuity between the flexible circuit and the array element. Various embodiments can also include an electrical device package interconnecting tightly packed electrical device arrays with a flexible circuit according to this method.

According to various embodiments, the present teachings also include another method for electrically interconnecting an electrical device with a flex circuit. In this method, a flexible circuit that includes at least one contact pad and at least one external contact attached on a first side of a flexible substrate can be provided. The flexible circuit can then be placed over a standoff layer that is placed over an electrical device array, wherein the first side of the flexible substrate is away from the electrical device array. A through-hole along the flexible substrate and along the standoff layer can then be formed such that the contact pad and the external contact can be exposed to the through-hole and aligned with one array element of the electrical device array. Conductive materials can be deposited to fill the through-hole connecting the bond pad, the contact pad and the external contact so as to establish an electrical continuity between the flexible circuit and the array element. Various embodiments can also include an electrical device package interconnecting tightly packed electrical device arrays with a flexible circuit according to this method.

Additional objects and advantages of the present teachings will be set forth in part in the description which follows, and in part will be obvious from the description, or may be learned by practice of the present teachings. The objects and advantages of the present teachings will be realized and attained by means of the elements and combinations particularly pointed out in the appended claims.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

It should be noted that some details of the FIGS. have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the present teachings may be practiced These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide interconnects and method for interconnecting an electrical device array with a flexible circuit. In one embodiment, the device array can be highly packed dense array. The flex circuit can include a flex substrate attached with a dense array of contact pads, accordingly. In various embodiments, an integral stencil can be formed and then can be used to form interconnects or interconnect components for electrical device packages.

As used herein, the term "interconnect" or "interconnect component" refers to a conductive component used to provide separate electrical paths (or electrical connections) between an electrical device and a flex circuit, for example, between a bond pad or electrode of an array element of a plurality of electrical device array elements and a contact pad attached to the flex circuit. In various embodiments, "interconnect" or "interconnect component" can also refer to a conductive component used to provide electrical paths between a contact pad of the flex circuit and an external contact of the flex circuit.

In various embodiments, the "interconnect" or "interconnect component" can be made of various conductive materials, for example, metal or metal alloys that are made by an electro-deposition process, an electroless deposition process, a wave soldering, a stencil printing or combinations thereof. The metal used can include, for example, Pb, Sn, In, Ag, Au, Cu, Ni or combinations thereof. In various embodiments, other suitable conductive materials known to one of ordinary skill in the art can also be used including, for example, a solder paste, or a conductive polymer material such as metal filled epoxy processed by a stencil printing technique.

In various embodiments, the bond pads or the electrodes for the electrical device array, and the contact pads/external contacts associated with the flex circuit can be made of same or different conductive materials as those for the interconnect components. These elements that are made of same or different conductive materials can be physically connected to provide an electrical path or an electrical connection.

Different interconnecting embodiments can be provided including (1) depositing or filling conductive materials in a through-hole along a flex substrate to contact a contact pad, the conductive materials surrounding the contact pad and further electrically connecting to the array element; and (2) depositing or filling conductive materials in a through-hole that is along the flex substrate, the through-hole exposing a bond pad of the array element and exposing both the contact pad and the external contact attached on the same side of the flex substrate. The disclosed assemblies or packaging processes can therefore be simple to operate, be low cost and be extended to desirable high densities.

In various embodiments, the electric device array can include a plurality of array elements, for example, packed with high density. The array element can include, but is not limited to, a PZT (i.e., lead zirconate titanate) element such as PZT actuator, a liquid crystal display, a plasma TV, or combinations thereof.

The flex circuit can include a flex substrate, for example, a polymer substrate that includes an electrically insulating flexible material. Suitable materials used for the polymer substrate can include, but are not limited to, polyimide, polyester, epoxy, urethane, polystyrene, silicone and/or polycarbonate. A representative thickness for the polymer substrate can be from about 25 µm to about 300 µm.

The flex circuit can also include an array or a pattern of contact pads formed on the polymer substrate for electrical connection, e.g., to bond pads of the electric device array. In various embodiments, the flex circuit can also include external contacts to electrically connect with external circuitry. The external contacts and the contact pads can be formed on the same or different side of the polymer substrate of the flex circuit.

In some embodiments, the contact pads can be formed on the polymer substrate of the flex circuit prior to formation of the external contacts. In an exemplary embodiment, the contact pads of the flex circuit can be formed by first blanket depositing a metallic layer on the polymer substrate, such as by electro-deposition, and then patterning and etching the deposited layer to form the contact pads having a desired structure and/or desired contact area. In various embodiments, a pitch and density of the contact pads or external contacts can depend on the specific application.

FIGS. 1A-1F depict an exemplary method for interconnecting an electrical device array with a flex circuit using an integral stencil in accordance with the present teachings. It should be readily apparent to one of ordinary skill in the art that the device 100 depicted in FIGS. 1A-1F represents a generalized schematic illustration and that other components/layers can be added or existing components/layers can be removed or modified.

Figure 1A:
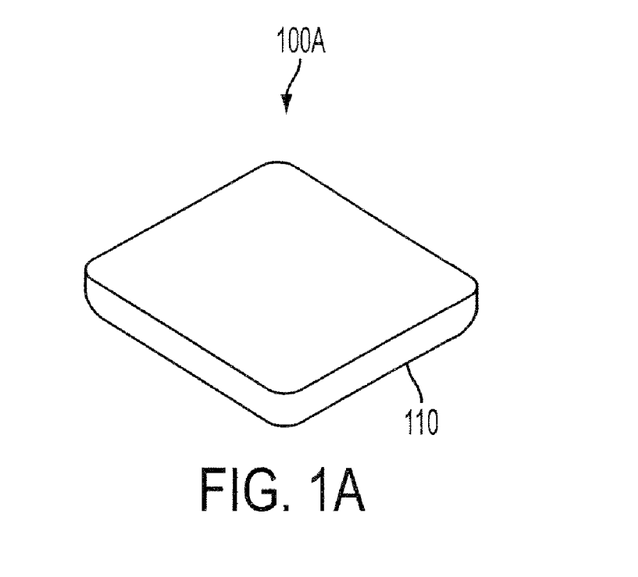
FIGS. 1A-1F depict an exemplary interconnecting method in accordance with the present teachings.

In FIG. 1A, the device 100A has one array element 110, which can be one of a plurality of array elements of an electrical device array. The device array can be formed, for example, on a wafer, a plastic, or other substrates. In an exemplary embodiment, the device array can include a piezoelectric array including a plurality of piezoelectric elements disposed in a planarized polymer. In various embodiments, the electrical device array that includes a plurality of array elements can be a highly packed device array.

Figure 1B:
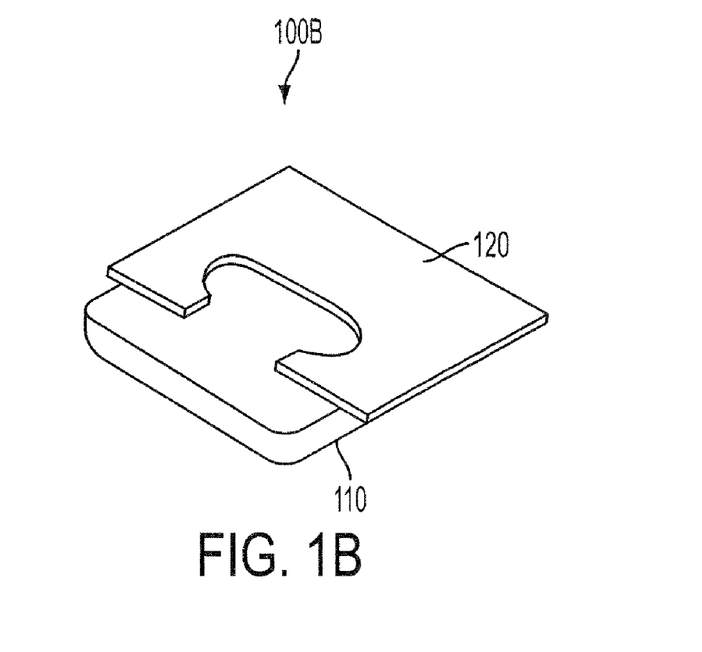

In FIG. 1B, a standoff layer 120 can be formed over the array element 110. In one embodiment, the standoff layer 120 can be attached to or bonded to the array element 110. In various embodiments, the standoff layer 120 can be electrically dielectric, for example, including a dielectric adhesive. Other exemplary suitable materials used for the standoff layer 120 can include acrylic polymer, epoxy, silicone, and/or adhesive blends. In various embodiments, the overlaying standoff layer 120 can have an opening to expose a portion of the underlying array element 110. The opening in the standoff layer 120 can be made, for example, from a precut, and can be aligned and positioned over the array element 110 of the electrical device array.

Figure 1C:
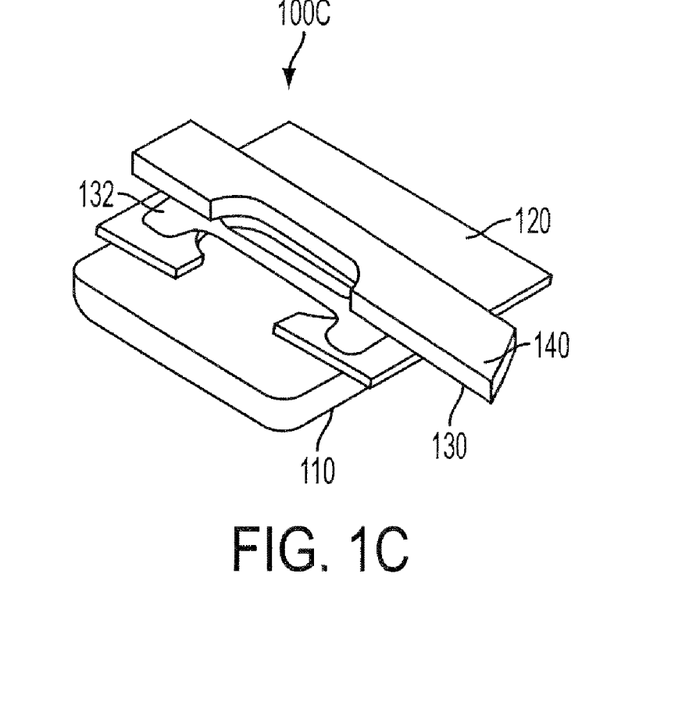

In FIG. 1C, a flex circuit 130 having a plurality of contact pads 132 on one side can be disposed over the standoff layer 120 of the device 100B of FIG. 1B. As shown in FIG. 1C, each contact pad 132 can correspond to one array element 110 of the electrical device array. The device 100C can further include a release liner 140 placed over the flex circuit 130 and on the side that is away from the array element 110, such as an opposing side of the contact pad 132.

In various embodiments, the array element 110, such as a PZT element, can be substantially aligned or pre-assembled with the contact pad 132 on flex circuit 130 with no electrical contact there-between. For example, the contact pad 132 can be placed over the aligned opening in the standoff layer 120 and cover a small portion of the underlying array element 110. In one embodiment, the contact pad 132 can be narrower than the opening in the standoff layer 120 such that the opening can be accessed, for example, by a viscous or fluidic material. In various embodiments, the contact pad 132 can span over the opening of the underlying standoff layer 120 contacting the standoff layer 120 on both ends or can suspend over the opening of the underlying standoff layer 120 with one end contacting the standoff layer 120.

The flex circuit 130 along with the liner layer 140 can include a through-hole. The through-hole along the flex circuit 130 and the liner layer 140 can be formed over the contact pad 132 and can be substantially aligned with the opening of the underlying standoff layer 120 In one embodiment, the through-hole can be pre-existing openings through the flex circuit 130 and the liner layer 140 and can be disposed over and aligned with the contact pad 132.

In another embodiment, the through-hole can be formed by first forming an assembled system followed by an etch process to form an etched integral stencil. The assembled system can include aligned layers including the release liner layer 140 over the flex circuit 130 having the contact pad 132 over the standoff layer 120 that is over the array element 110. A portion of the assembled flex substrate of the flex circuit 130 and the liner layer 140 that is associated with the through-hole can then be removed after this pre-assembly.

Such removal can be performed by an etching technique, for example, a chemical etching process, and/or a laser ablation technique using one or more of a $CO_2$ laser, an excimer laser, a solid state laser, a copper vapor laser, or a fiber laser. For example, after the contact pad 132 is defined, a chemical etching process suitable for the exemplary polyimide substrate or a laser ablation process can be performed to form the through-hole along the flex circuit 130 and the release liner layer 140.

In various embodiments, the removal of the flex substrate portion may or may not include a removal of a portion of the contact pad 132 depending on the location or arrangement of contact pad on the flex circuit 130. In various embodiments, the contact pad 132 can be anchored at both ends on the flexible substrate 130 as shown in FIG. 1C. Alternatively, the contact pad 132 can have one end anchored on the flexible substrate 130 and can have the other end free-standing or suspended (not illustrated) inside the formed through-hole along the flex circuit 130 and the release liner layer 140.

One advantage of pre-forming the disclosed assembled system for forming the through-hole, the integral stencil, is that the flex substrate, such as the polyimide, of the flex circuit 130 can be used as a mechanical support for the thin contact pad 132 that is placed over the opening of the standoff layer 120. In various embodiments, suitable pressure and/or temperature bonding processes known to one of ordinary skill in the art can be used for assembling each layer of the device 100C.

The release liner layer 140 on top of the flex circuit 130 can be a thin protective layer and can be removed after formation of the electrical interconnects between the flex circuit 130 and the array element 110.

Figure 1D:
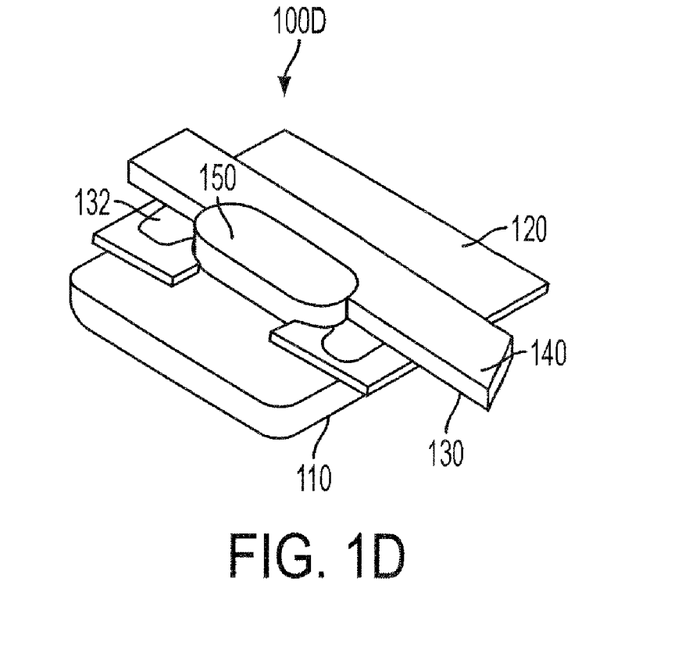

In FIG. 1D, an interconnect component 150 can be formed by, for example, depositing conductive materials into the through-hole along the release liner layer 140 and the substrate of the flex circuit 130 contacting the contact pad 132 and further into the underlying opening of the standoff layer 120. For example, conductive adhesives, such as metal filled epoxies, and/or solder pastes, can be forced into the through-hole of the release liner and polyimide substrate and then into the opening of the standoff layer, and in some cases, surrounding the contact pad 132.

In this manner, the through-hole along the release liner layer and the flex substrate can be used as an integral stencil to restrict the location of the conductive materials to a desired contact area of the contact pad 132. By having the contact pad not covering (e.g., narrower than) the entire opening of the standoff layer 120, the viscous conductive materials can flow around the contact pad 120 and touch, e.g., a bond pad 115 of the device array element 110.

In various embodiments, the viscous conductive materials can then be solidified, for example, cured or solder re-flowed depending on the materials and methods used, to create the interconnect component 150 in the opening of the standoff layer 120 and in the through-hole along the flex circuit 130 and the release liner layer 140. Interconnect component 150 can be a robust electrical interconnection between the contact pad 132 of the flex circuit 130 and the bond pad 115 of the array element 110.

In some embodiments, conductive materials, such as conductive epoxies, can be dispensed into the opening in the standoff layer 120 and into the through-hole along the flex circuit 130 and the release liner layer 140 (see FIG. 1C) by, for example, a syringe dispenser or other type of dispenser. Alternatively, conductive materials, such as conductive epoxies, can be stenciled into the opening and the through-hole shown in FIG. 1C to form the interconnect component 150 as shown in FIG. 1D.

Figure 1E:
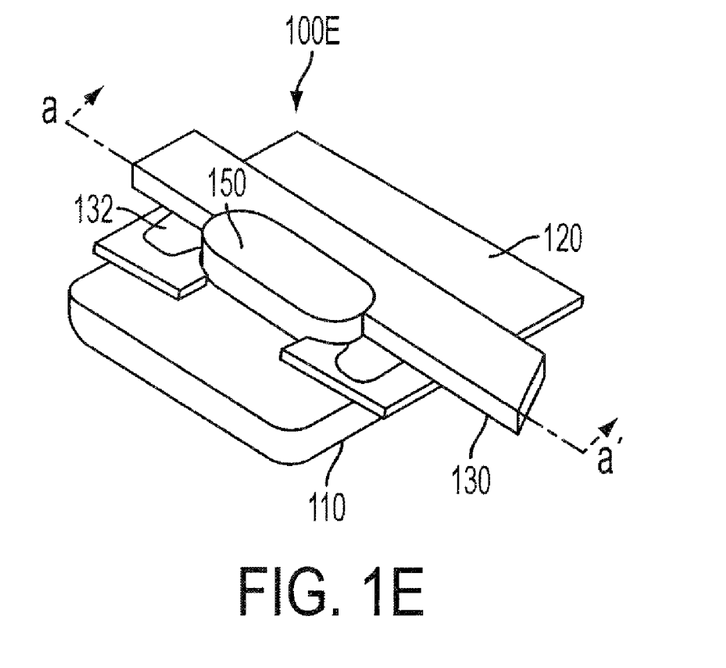

In FIG. 1E, the thin release liner layer 140 can be removed to ensure that each electric device array element can be isolated from one another. For example, the removal of the release liner layer 140 can take away undesired conductive materials that may create electrical shorts between elements of the array. In various embodiments, when the conductive materials are dispensed or stenciled to form the interconnect component 150, the release liner 140 may or may not be used as disclosed herein.

Figure 1F:
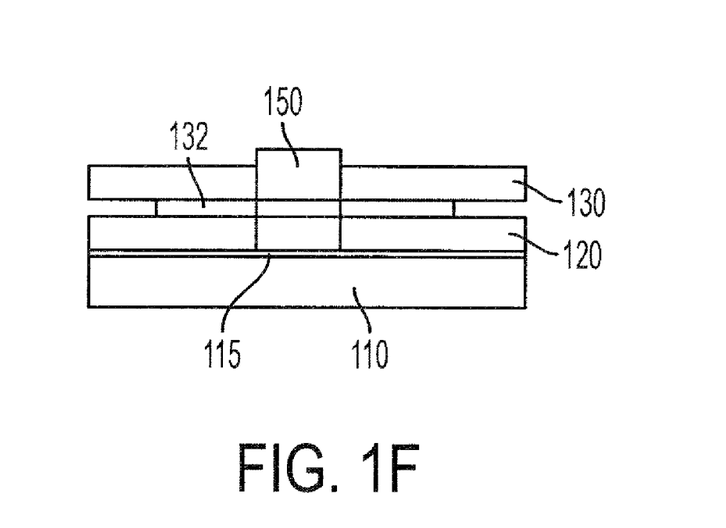

While FIGS. 1A-1E depict perspective views of the device 100 during formation of the interconnect component 150, FIG. 1F is an exemplary cross-sectional view in the direction a-a' of the device 100E in FIG. 1E in accordance with the present teachings.

As shown, the flex circuit 130 can be electrically connected with one device array element 110 through the contact pad 132 and the interconnect component 150. The interconnect component 150 can be deposited into the opening of the underlying standoff layer 120 to electrically connect the bond pad 115 of the device array element 110 with the contact pad 132. The interconnect component 150 can also be deposited on the contact pad 132 to fill the through-hole along the flex circuit 130 and the overlaying release liner 140. In addition, the interconnect component 150 can be formed surrounding the contact pad 132. Following the removal of the release liner 140, the interconnect component 150 and the flex circuit 130 can be exposed. In various embodiments, the exposed interconnect component 150 can be connected to or used as an external contact for the flex circuit 130. Alternatively, the external contact for the flex circuit 130 can be pre-attached to the contact pad 132.

In various embodiments, the bond pad 115 can be an electrode or a conductive thin layer covering the entire surface of the device array element 110.

Figure 2A:
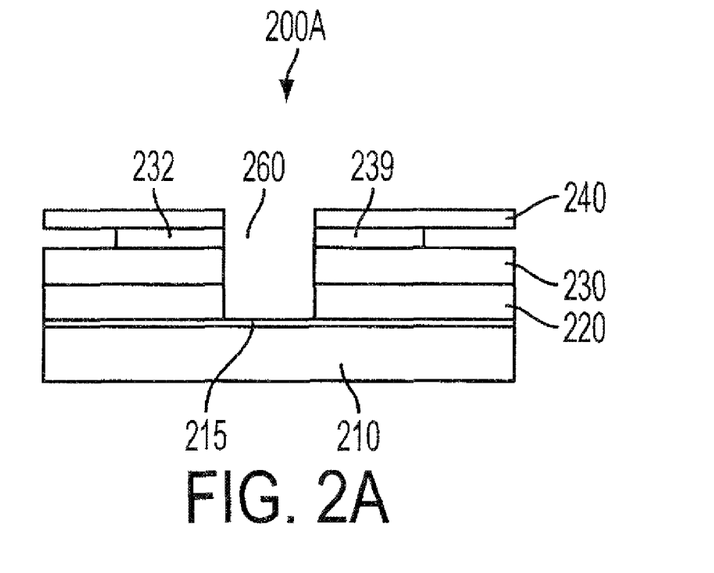
FIGS. 2A-2B depict another exemplary interconnecting method in accordance with the present teachings.
Figure 2B:
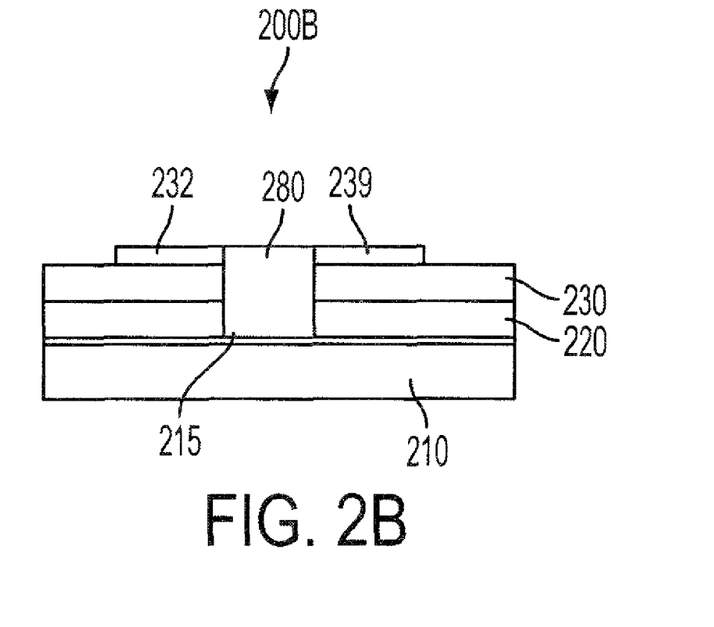

Various embodiments can include an alternative method for interconnecting electrical devices with its circuitry. For example, the contact pad and the external contact of the flex circuit can be arranged on the same side of the flex substrate which is away from the associated array element. FIGS. 2A-2B depict another exemplary interconnecting method in accordance with the present teachings.

In FIG. 2A, the device 200A can include a flex circuit 230 assembled over a device array element 210 through a standoff layer 220 placed there-between. The flex circuit 230 can have a contact pad 232 and an external contact 239 attached to the same side of the flex substrate, which is away from, e.g., on an opposite side of, the array element 210. A release liner layer 240 can be formed over the flex circuit 230, in particular, over the contact pad 232 and the external contact 239.

In various embodiments, the device array element, the standoff layer, the flex circuit and the attached contact pad/external contact, the release liner layer, and assembly methods can be similar or different to those described in FIGS. 1A-1F.

Further, as shown in FIG. 2A, a through-hole 260 can be formed along the release liner 240, the flex circuit 230, and the standoff layer 220, that are assembled on the device array element 210. The through-hole 260 can expose, for example, a bond pad 215 of the underlying array element 210. The through-hole 260 can also expose a portion of the contact pad 232 and a portion of the external contact 239.

The through-hole 260 can be formed by removing portions of the release liner 240, the flex circuit 230, and/or the standoff layer 220 using various suitable removal processes including, but not limited to, a chemical etching process, a laser ablation, or other known methods. The through-hole 260 can be aligned with the underlying array element 210.

In various embodiments, the through-hole 260 can be used as an integral stencil for applying conductive materials, for example, a conductive adhesive, a solder paste, a metal or a metal alloy, to form an interconnect component 280, as shown in FIG. 2B. The interconnect component 280 can electrically connect the bond pad 215 of the array element 210 at the bottom with the contact pad 232 on top of the flex circuit 230 and can also electrically connect the contact pad 232 with the external contact 239 of the flex circuit 230 Following the formation of the interconnect component 280, the release liner 240 can be removed.

In various embodiments, the cross-sectional shapes of the openings, through-holes, and corresponding components shown in FIGS. 1A-1F, and 2A-2B are exemplary. Any suitable cross-sectional shapes, regular or irregular, can be used including, but not limited to, a square, oval, rectangle, triangle, or polygon.

Figure 3:
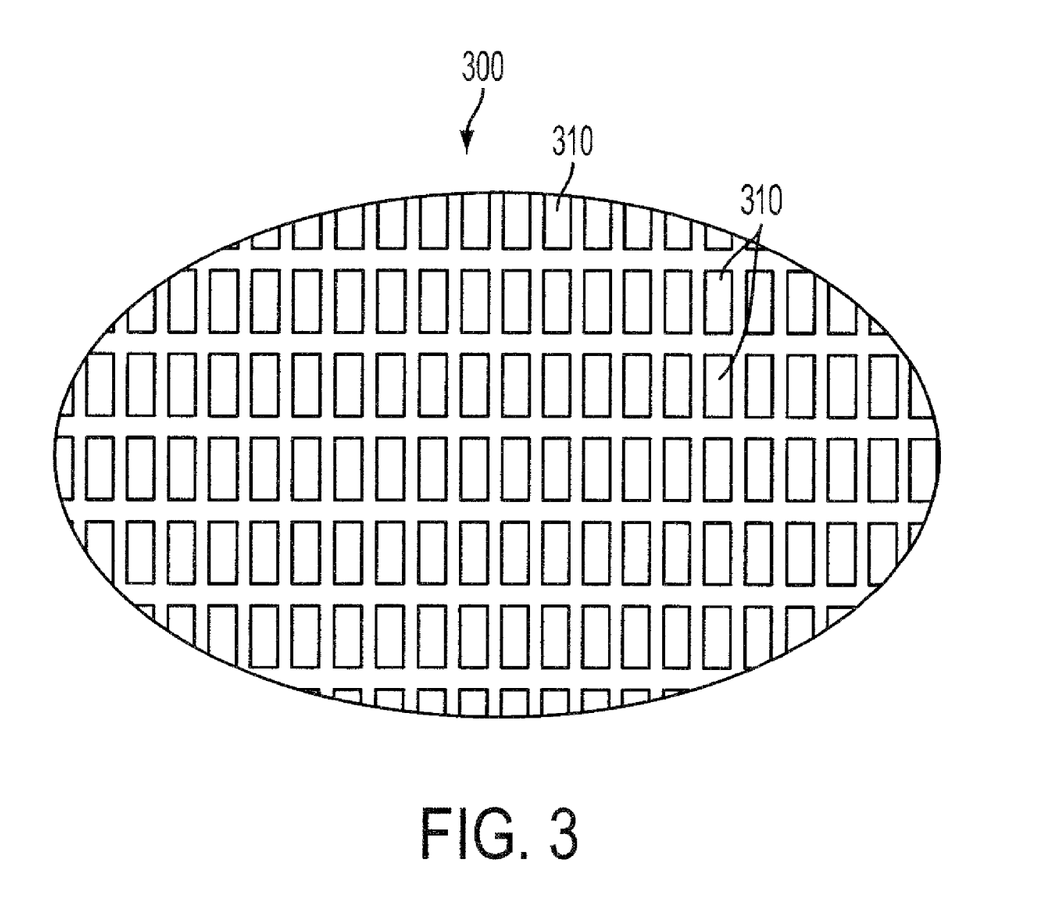
FIG. 3 depicts a portion of an exemplary highly packed electrical device array in accordance with the present teachings.

In various embodiments, the devices in each step shown in FIGS. 1A-1F, and 2A-2B can be repeated as desired and can be mass manufactured simultaneously. For example, FIG. 3 depicts a portion of an exemplary electrical device array 300 that includes a plurality of array elements 310 (also see 110 in FIGS. 1A-1F, and see 210 in FIGS. 2A-2B). The plurality of array elements 310 can include various electrical devices or patterns of electrical devices. The plurality of array elements 310 can be highly packed, for example, on a wafer, to form the electrical device array 300. As described in FIGS. 1A-1F, and 2A-2B, each array element 310 can have separate electrical paths with one of contact pads of the flexible circuit. Accordingly, the standoff layer placed between the flex circuit and the electrical device array can include a plurality of openings or interconnect components so as to form a plurality of interconnected or packaged devices shown in FIGS. 1A-1F, and 2A-2B.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function Furthermore, to the extent that the terms "including," "includes," "having," "has," "with," or variants thereof are used in either the detailed description and the claims, such terms are intended to be inclusive in a manner similar to the term "comprising."

Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An interconnecting method comprising:
pre-aligning a contact pad of a flexible circuit with an array element of an electrical device array having a standoff layer disposed between the contact pad and the array element, wherein the standoff layer comprises an opening and the contact pad covers a portion of the opening;
removing a substrate portion of the flexible circuit to form a through-hole along the flexible circuit and to expose the contact pad; and
filling a conductive material into the opening of the standoff layer and into the formed through-hole along the flexible circuit; wherein the conductive material contacts a bond pad of the array element and contacts the contact pad of the flexible circuit so as to establish an electrical continuity.

2. The method of claim 1, further comprising
forming a release liner layer over the flexible circuit prior to forming the through-hole;
forming the through-hole along the flexible circuit and along the overlaying release liner;
filling the conductive material into the opening of the standoff layer and the through-hole; and
removing the release liner layer to expose the flexible circuit.

3. The method of claim 1, further comprising dispensing or stenciling the conductive material into the opening of the standoff layer and into the formed through-hole along the flexible circuit.

4. The method of claim 1, further comprising solidifying the filled conductive material to form an interconnection component between the array element and the flexible circuit.

5. The method of claim 1, wherein the conductive material filled in the opening of the standoff layer and in the through-hole along the flexible circuit surrounds the contact pad of the flexible circuit.

6. The method of claim 1, further comprising using a laser ablation or a chemical etching process to remove the substrate portion of the flexible circuit to form the through-hole.

7. The method of claim 6, wherein the contact pad is anchored on the flexible circuit at two ends of the contact pad.

8. The method of claim 6, further comprising removing a first portion of the contact pad of the flexible circuit and exposing a second portion of the contact pad, when the substrate portion of the flexible circuit is removed.

9. The method of claim 8, wherein the contact pad is attached to the flexible circuit on one end, the other end being suspended in the through-hole.

10. The method of claim 1, wherein the contact pad is narrower than the opening in the standoff layer.

11. The method of claim 1, wherein the conductive material comprises a conductive adhesive or a solder paste.

12. The method of claim 1, wherein the standoff layer comprises a dielectric adhesive, an acrylic polymer, an epoxy, a silicone, or an adhesive blend.

13. The method of claim 1, wherein the array element comprises a bond pad or an electrode contacting the filled conductive material.

14. An interconnecting method comprising:
   providing a flexible circuit that comprises at least one contact pad and at least one external contact attached on a first side of a flexible substrate;
   placing the flexible circuit over a standoff layer that is placed over an electrical device array, wherein the first side of the flexible substrate is away from the electrical device array;
   forming a through-hole along the flexible substrate and along the standoff layer such that the contact pad and the external contact are exposed to the through-hole and aligned with one array element of the electrical device array; and
   depositing a conductive material to fill the through-hole to connect the bond pad, the contact pad and the external contact.

15. The method of claim 14, further comprising using a laser ablation or a chemical etching process to remove a substrate portion of the flexible circuit to form the through-hole.

16. The method of claim 14, wherein the conductive material comprises a metal, a metal alloy, a metal filled epoxy, a solder paste or combinations thereof.

17. The method of claim 14, further comprising placing a release liner layer over the contact pad and the external contact prior to the formation of the through-hole and removing the release liner layer after the deposition of the conductive material.

* * * * *